United States Patent
Dai et al.

(10) Patent No.: US 8,938,035 B1
(45) Date of Patent: Jan. 20, 2015

(54) SYSTEM AND METHOD FOR TRANSFERRING DATA OVER A TWO-PAIR COMMUNICATION SYSTEM

(71) Applicant: Marvell International Ltd., Hamilton (BM)

(72) Inventors: Shaoan Dai, San Jose, CA (US); Kok-Wui Cheong, Mountain View, CA (US)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 13/773,907

(22) Filed: Feb. 22, 2013

Related U.S. Application Data

(60) Provisional application No. 61/604,679, filed on Feb. 29, 2012, provisional application No. 61/604,667, filed on Feb. 29, 2012.

(51) Int. Cl.
 *H04L 27/06* (2006.01)
 *H04L 1/00* (2006.01)

(52) U.S. Cl.
 CPC .................................. *H04L 1/0054* (2013.01)
 USPC .......................................... 375/341; 714/796

(58) Field of Classification Search
 CPC ..... H04L 1/0054; H04L 1/006; H04L 1/0071; H04B 10/6971; H03M 13/256
 USPC ................... 375/233, 341; 714/796
 See application file for complete search history.

(56) References Cited

U.S. PATENT DOCUMENTS

| | | | |
|---|---|---|---|
| 5,056,117 A | 10/1991 | Gitlin et al. | |
| 5,513,216 A | 4/1996 | Gadot et al. | |
| 5,604,769 A | 2/1997 | Wang | |
| 5,872,817 A | 2/1999 | Wei | |
| 6,704,903 B1 | 3/2004 | Leung et al. | |
| 6,870,881 B1 | 3/2005 | He | |
| 7,139,312 B2 | 11/2006 | Graumann | |
| 7,194,029 B2 | 3/2007 | Agazzi et al. | |
| 7,388,924 B1 | 6/2008 | Lou et al. | |
| 7,961,797 B1 | 6/2011 | Yang et al. | |
| 8,015,477 B2 | 9/2011 | Stockmanns et al. | |
| 8,271,863 B2 | 9/2012 | Yang et al. | |
| 8,294,606 B2 * | 10/2012 | Zimmerman et al. | 341/155 |
| 2003/0115541 A1 * | 6/2003 | Azadet et al. | 714/796 |
| 2004/0008794 A1 * | 1/2004 | McClellan | 375/260 |
| 2005/0018786 A1 * | 1/2005 | Parhi et al. | 375/265 |
| 2008/0069144 A1 * | 3/2008 | Yu et al. | 370/476 |
| 2014/0112376 A1 * | 4/2014 | Wang et al. | 375/219 |

OTHER PUBLICATIONS

Sequence Detection, Chapter 9, undated, pp. 66-146.

* cited by examiner

*Primary Examiner* — Kabir A Timory
*Assistant Examiner* — David S Huang

(57) ABSTRACT

Systems and methods for transferring data over a 2-pair communication system. Two input data streams are received at a Viterbi detector. The two input data streams are converted into an output signal at the Viterbi detector. Each of the input data streams includes a first data symbol interleaved with a second data symbol. A first set of branch metric values is computed for the first data symbols of the two input data streams. A second set of branch metric values is computed for the second data symbols of the two input data streams, where the computing of the second set is based on the first set. Each of the two input data streams is de-interleaved and down-sampled to generate the output signal, where the output signal includes four channels of data generated based on the first and second sets of branch metric values. Each of the four channels is of a lower data rate than each of the two input data streams.

19 Claims, 9 Drawing Sheets

SYSTEM AND METHOD FOR TRANSFERRING DATA OVER A TWO-PAIR COMMUNICATION SYSTEM

CROSS-REFERENCE TO RELATED APPLICATIONS

This claims priority to U.S. Provisional Patent Application 61/604,667, filed on Feb. 29, 2012, and to U.S. Provisional Patent Application 61/604,679, filed on Feb. 29, 2012, both of which are incorporated herein by reference.

TECHNICAL FIELD

The technology described in this document relates generally to a communication system and more particularly to systems and methods for transferring data over a two-pair communication system.

BACKGROUND

Gigabit Ethernet (i.e., 1000BASE-T) is a communication technology that enables 1 gigabit per second (Gbps), full duplex communication. To obtain this performance level, gigabit Ethernet transceivers are generally interconnected with a multi-pair transmission channel architecture. Thus, transceivers may be connected using four separate pairs of twisted Category-5 (CAT-5) copper wires, with each pair operating at 250 megabits per second (Mbps). Digital information being processed for transmission over the copper wires may be symbolically represented in accordance with a five-level pulse amplitude modulation scheme (PAM-5) and encoded using an 8-state Trellis coding methodology. At a receiver, the digital information transmitted is extracted from a multi-level signal.

SUMMARY

The present disclosure is directed to systems and methods for transferring data over a 2-pair communication system. A communication device configured for operation with a 2-pair communication system includes a Viterbi detector configured to receive two input data streams and to convert the two input data streams into an output signal. The Viterbi detector is configured to execute steps including receiving the two input data streams, where each of the input data streams includes a first data symbol interleaved with a second data symbol. At the Viterbi detector, a first set of branch metric values is computed for the first data symbols of the two input data streams, and a second set of branch metric values is computed for the second data symbols of the to input data streams. The computing of the second set of branch metric values is based on the first set of branch metric values. The Viterbi detector is further configured to de-interleave and downsample each of the two input data streams to generate the output signal. The output signal includes four channels of data generated based on the first and second sets of branch metric values, with each of the four channels being of a lower data rate than each of the two input data streams.

In another example, in a method for transferring data over a 2-pair communication system, two input data streams are received at a Viterbi detector. The two input data streams are converted into an output signal at the Viterbi detector. Each of the input data streams includes a first data symbol interleaved with a second data symbol. A first set of branch metric values is computed for the first data symbols of the two input data streams. A second set of branch metric values is computed for the second data symbols of the two input data streams, where the computing of the second set is based on the first set. Each of the two input data streams is de-interleaved and down-sampled to generate the output signal, where the output signal includes four channels of data generated based on the first and second sets of branch metric values. Each of the four channels is of a lower data rate than each of the two input data streams.

DETAILED DESCRIPTION

Figure 1:
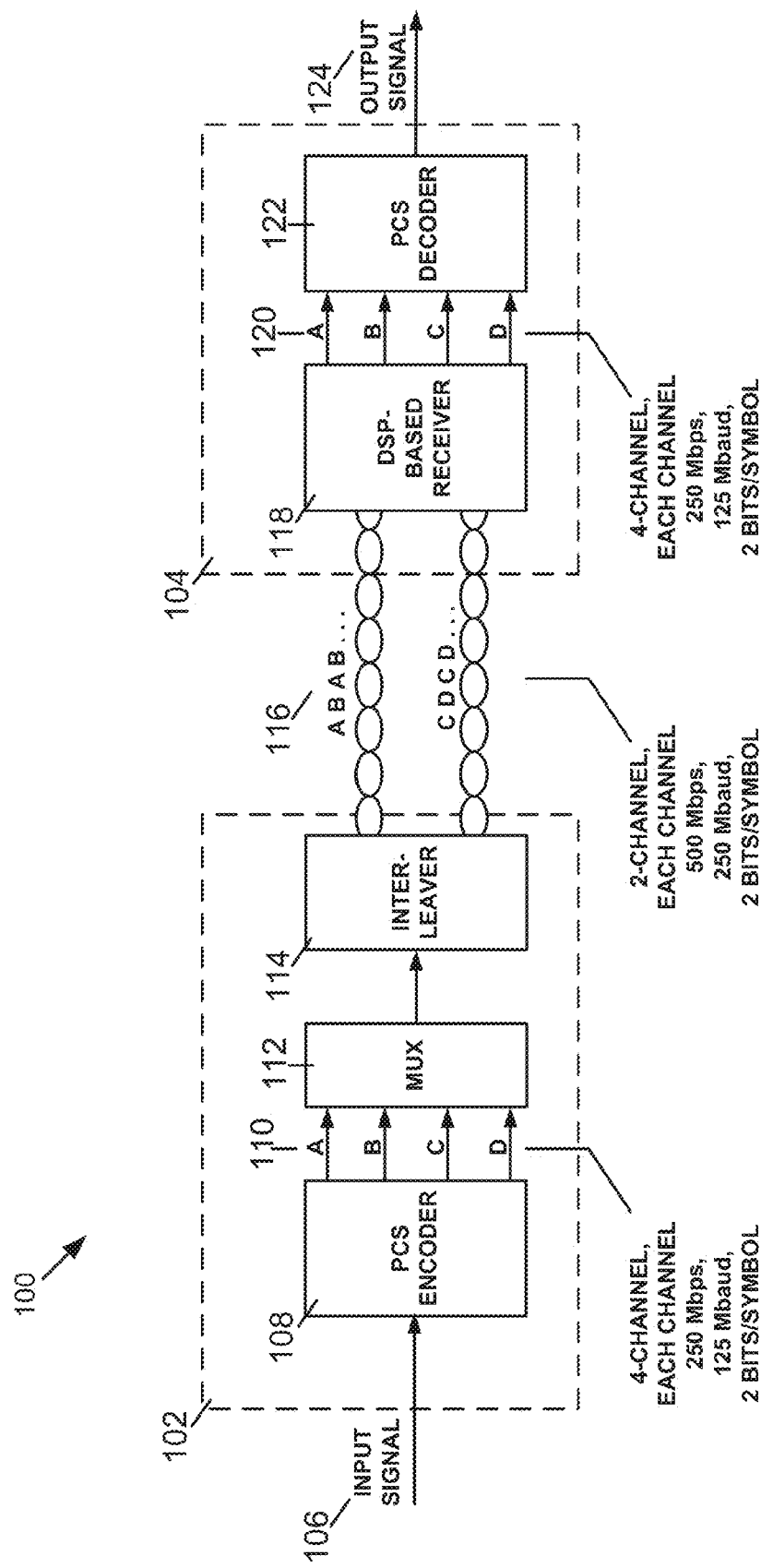
FIG. 1 is a block diagram of an example bidirectional communication system including two transceivers configured to communicate over two twisted-pair wiring channels.

FIG. 1 is a block diagram of an example bidirectional communication system 100 including two transceivers 102, 104 configured to communicate over two twisted-pair cables 116. In FIG. 1, an input signal 106 to be transmitted between the transceivers 102, 104 is received at the first transceiver 102. In the first transceiver 102, the input signal 106 is received at a Physical Coding Sublayer (PCS) encoder 108, which may perform scrambling, coding, and a variety of other control functions on the input signal 106. Further, in the PCS encoder 108, eight bits of data may be encoded to nine bits, and the nine bits may be further encoded to four Pulse Amplitude Modulation (PAM-5) signals. A corresponding data symbol for each PAM-5 signal may undergo pulse shaping at a pulse shaper and digital to analog conversion at a 125 MHz D/A converter. The resulting output of the PCS encoder 108 may include four channels of data 110, with each channel having a data rate of 250 Mbps and a symbol rate of 125 Mbaud, with 2 bits per symbol. Each of the four channels of data 110 includes data corresponding to a particular data symbol (i.e., data symbols "A," "B," "C", and "D").

The 4-channel data 110 is multiplexed and interleaved at multiplexer 112 and interleaver 114, respectively. The multiplexed and interleaved data is transmitted at a data rate of 500 Mbps and a symbol rate of 250 Mbaud, with 2.32 bits per symbol for PAM5, over the two twisted-pair cables 116. As illustrated in FIG. 1, the data symbols "A" and "B," originally transmitted via separate channels of the four-channel data 110, are interleaved and transmitted together via a first twisted pair cable of the cables 116. Similarly, the data symbols "C" and "D" are interleaved and transmitted together via a second twisted pair cable of the cables 116. Thus, in the communication system 100 of FIG. 1, four-channel, 250 Mbps data 110 is converted into two-channel, 500 Mbps data 116. Use of the four-channel, 250 Mbps data prior to the conversion may allow the system 100 to interface with legacy 1000BASE-T PCS hardware. Although the example system 100 of FIG. 1 depicts output from the PCS encoder 108 being received by the multiplexer 112 and interleaver 114, in other examples, the arrangement of these components may vary. For instance, in another example, a PCS encoder may be directly coupled to the two twisted-pair cables 116, and multiplexing and de-interleaving may occur prior to or contemporaneously with the PCS encoding.

Within the second transceiver 104, a DSP-based receiver 118 is used to de-interleave the two-channel data received via the two twisted pair cables 116 and convert the two-channel, 500 Mbps data back into four-channel, 250 Mbps data 120. The DSP-based receiver 118 may include a variety of components, including a feed forward equalizer (FEE), decision feedback equalizer (DFE), Echo/NEXT Canceller, Base Line Wandering (BLW) correction circuit, decision circuit (e.g., Viterbi detector), Decision Feedback Sequence Estimator (DFSE) block, or data slicer. Various example configurations of the DSP-based receiver 118 are described in further detail below. In one example configuration of the DSP-based receiver 118, a Viterbi detector (e.g., Viterbi detector 252 discussed below in connection with FIG. 2) included in the DSP-based receiver 118 may be automatically enabled or disabled based on a length of a cable connected to the DSP-based receiver 118. For example, a cable length detection module (not shown) may deter nine that the length of the cable is long (e.g., greater than a predetermined length) and subsequently enable the Viterbi detector. The cable length detection module may alternatively determine that the length of the cable is short (e.g., less than the predetermined length) and disable the Viterbi detector. In one example, the predetermined length corresponds to 10 meters. The cable length detection module may also disable the Viterbi detector in a power-saving mode. The four-channel, 250 Mbps, 125 Mbaud data 120 is received by a PCS decoder 122 and used to generate an output signal 124 corresponding to the input signal 106.

The bidirectional communication system 100 of FIG. 1 may be configured to function as a two-pair gigabit Ethernet system (e.g., 2-pair gigabit auto-Phy) and may be used in a variety of applications. For example, in automotive applications, the system 100 may be used to transmit data within a variety of vehicles (e.g., an automobile, truck, bus, train, ship, boat, aircraft, etc). In such automotive applications, certain requirements may vary from those of the general consumer or industrial market (e.g., fewer wires and tight electromagnetic compatibility may be required), and the two-pair communication system 100 of FIG. 1 may be configured to meet such requirements. Although transceiver 102 is depicted as including transmitting components and transceiver 104 is depicted as including receiving components, both transceivers 102, 104 may include transmitting and receiving components, as well as other additional components. Further, although the example system 100 depicts interleaving of two sequential data symbols on each of the cables 116, in other examples, three or more data symbols may be interleaved and transmitted over the 2-pair system 100.

Figure 2:
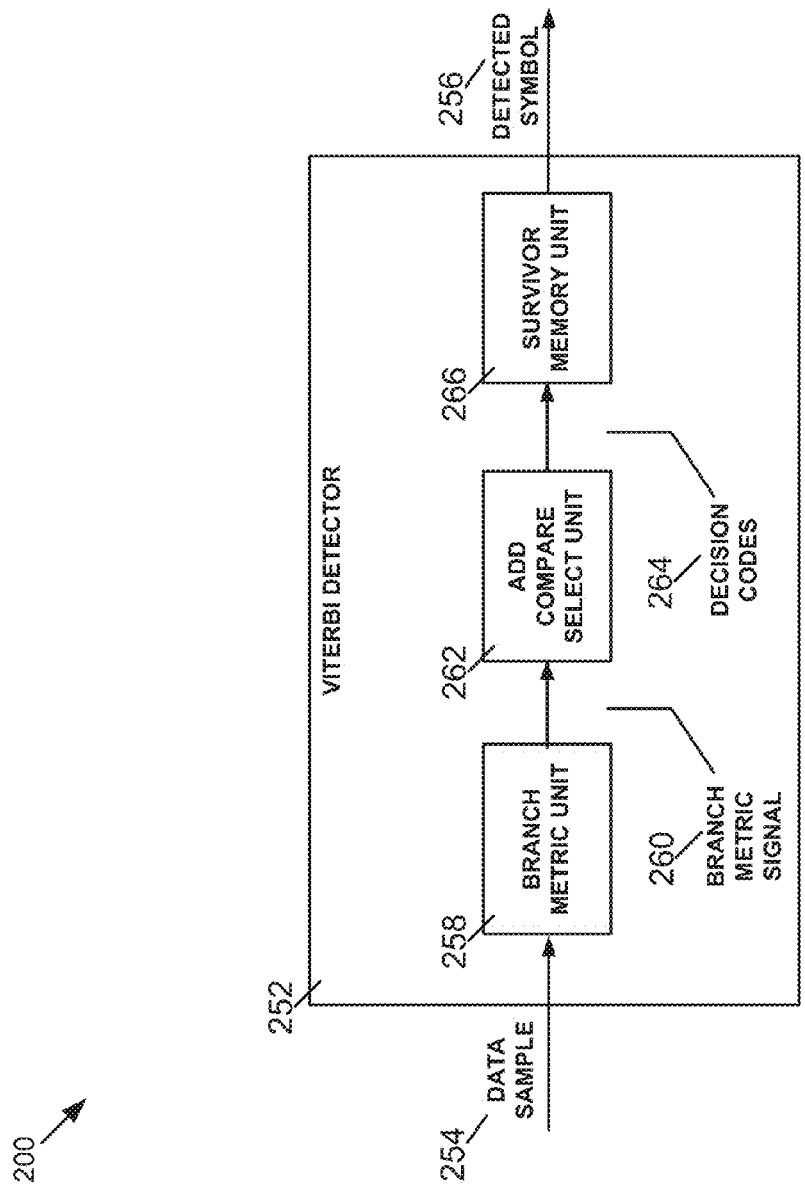
FIG. 2 depicts a block diagram, which includes components of an example Viterbi detector.

FIG. 2 depicts a block diagram 200, which includes components of an example Viterbi detector 252. A 2-pair Ethernet transceiver may include a DSP-based receiver, and the DSP-based receiver may include a Decision Feedback Sequence Estimator (DFSE) for providing sequence estimation (e.g., Viterbi decoding) and equalization (e.g., via a Decision Feedback Equalizer) on a received signal. To enable the sequence estimation, the DFSE may include the example Viterbi detector 252, which is a maximum likelihood detector used to implement the Viterbi algorithm. The Viterbi detector 252 may be used as an error correction device that is used in decoding input signals that were encoded using a Trellis coding methodology.

In response to receiving a stream of binary digital data samples 254, the Viterbi detector 252 generates a binary digital output signal 256 representative of a detected symbol. Performing the maximum likelihood detection may involve analyzing a number of consecutive input data samples 254 to determine the most likely path, and the Viterbi algorithm may use an iterative process in making the determination. The Viterbi detector 252 may implement a predetermined trellis diagram by having a given number of states, where for each state, the Viterbi detector 252 determines a branch metric value for each branch entering the state, a state metric value, and a survivor branch. To accomplish these tasks, the Viterbi detector 252 includes a branch metric unit 258, an add-compare-select (ACS) unit 262, and a survivor memory unit 266, as illustrated in FIG. 2.

The branch metric unit 258 may receive the stream of binary digital data samples 254, determine a branch metric value for each state, and output the branch metric value within a branch metric signal 260. The branch metric signal 260 includes the branch metric value for each discrete, equalized value of the input data 254, and the branch metric value may be provided in a binary representation. In a two-pair communication system where two-channel interleaved data is received at a DSP-based receiver of which the branch metric unit 258 is a pa the branch metric calculation may be divided into two phases. A second of the two phases may utilize output produced in a first phase of the two phases. The two phases of the branch metric calculation in the two-pair communication system are described in further detail below with respect to FIG. 3.

The branch metric signal 260 containing the branch metric value may be input into the ACS unit 262 along with a state metric signal containing a state metric value. The ACS unit 262 may include an adding unit, a comparator, a selector, and a latch. At any particular time, the state metric value indicates a cost associated with the best path through the trellis diagram to the state, and is therefore a measure of the likelihood of the path. The state metric value may be stored in a memory device, such as the latch of the ACS unit 262. Based on the received inputs, the ACS unit 262 outputs decision codes 264, which are received by the survivor memory unit 266. The survivor memory unit 266 processes the decision codes 264 from the ACS unit 262 and generates the binary digital output signal 256, where the digital binary output signal 256 is representative of the symbol detected by the Viterbi detector 252. The output signal 256 may be received and processed by a decoder block (e.g., the PCS decoder 122 of FIG. 1) to recover a signal representative of the transmitted source signal. When utilized in a two-pair communication system (e.g., within the DSP-based receiver 118 of FIG. 1), the Viterbi detector 252 may output data at a data rate of 250 Mbps and a symbol rate of 125 Mbaud, with 2 bits per symbol.

Figure 3:
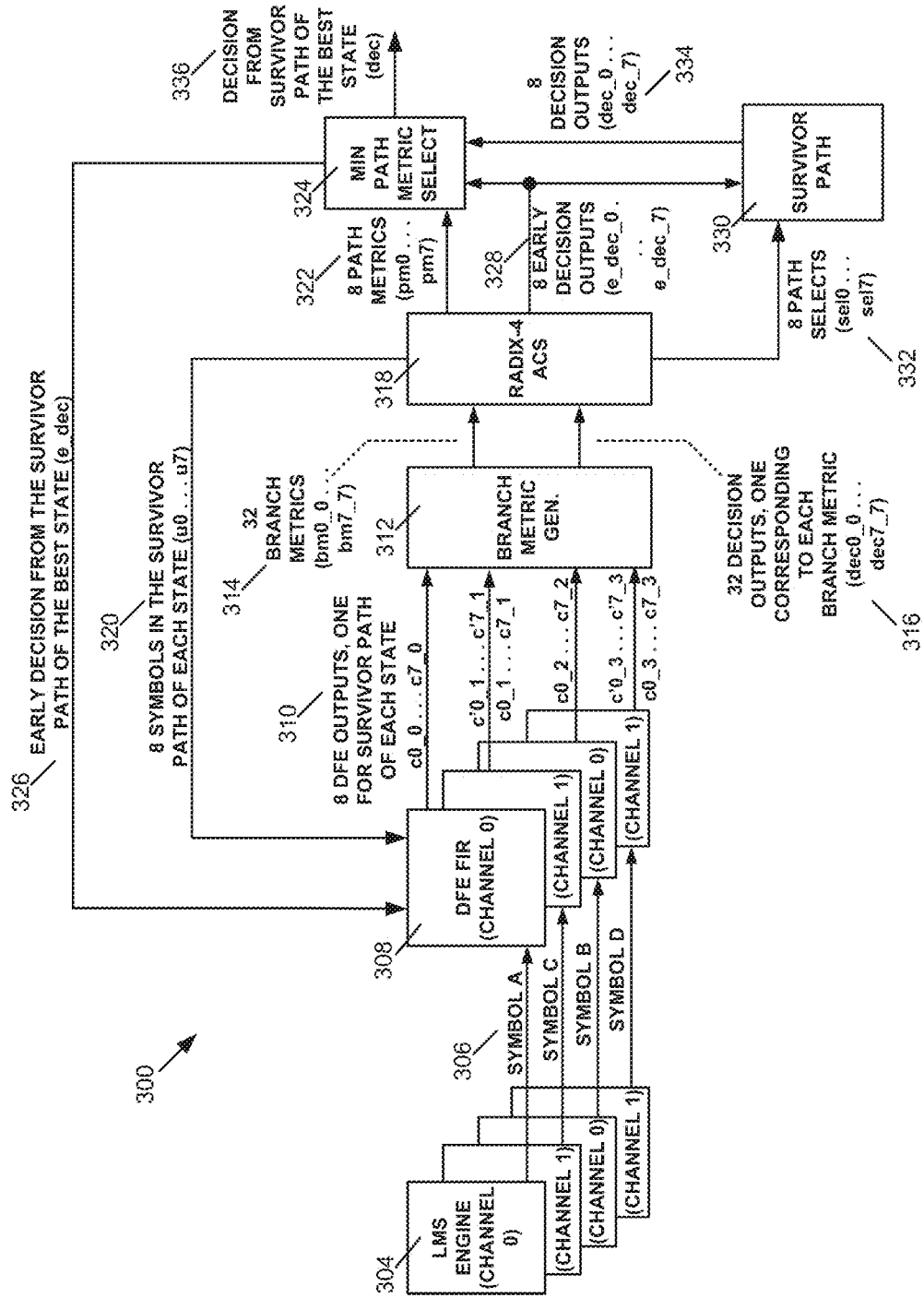
FIG. 3 is a diagram depicting an example block DFSE decoder for use in a 2-pair communication system.

FIG. 3 is a diagram depicting an example Decision Feedback Sequence Estimator (DFSE) block 300 for use in a 2-pair communication system. The DFSE 300 of FIG. 3 may be a component of a DSP-based receiver (e.g., the DSP-based receiver 118 of the gigabit Ethernet communication system 100 of FIG. 1) and may be used to provide sequence estimation (e.g., Viterbi decoding) and equalization on a received input signal. In the DFSE 300, data from each channel of a two-channel input signal is de-interleaved and downsampled. In one example, the input signal includes two channels, with each channel having a data rate of 500 Mbps and a symbol rate of 250 Mbaud. In this example, the DFSE 300 may be used to de-interleave and convert the input signal into four-channel, 250 Mbps, 125 Mbaud data. The DFSE 300 may include a slicer, decision feedback equalizer (DFE), and Viterbi detector components. The slicer may be used to resolve data symbols in input data streams, and the decision feedback equalizer may be used to filter the input data streams (e.g., to remove postcursor inter-symbol interference from the input data streams.). In the DFSE 300, the Viterbi detector may include branch metric generation module 312, ACS 318, minimum path metric select unit 324, and survivor path module 330 components, and may be used to improve cable performance in a 2-pair gigabit Ethernet communication system. The DFSE 300 may be used to obtain up to 6 dB of coding gain within uncoded PAM-5 signaling.

Figure 6:
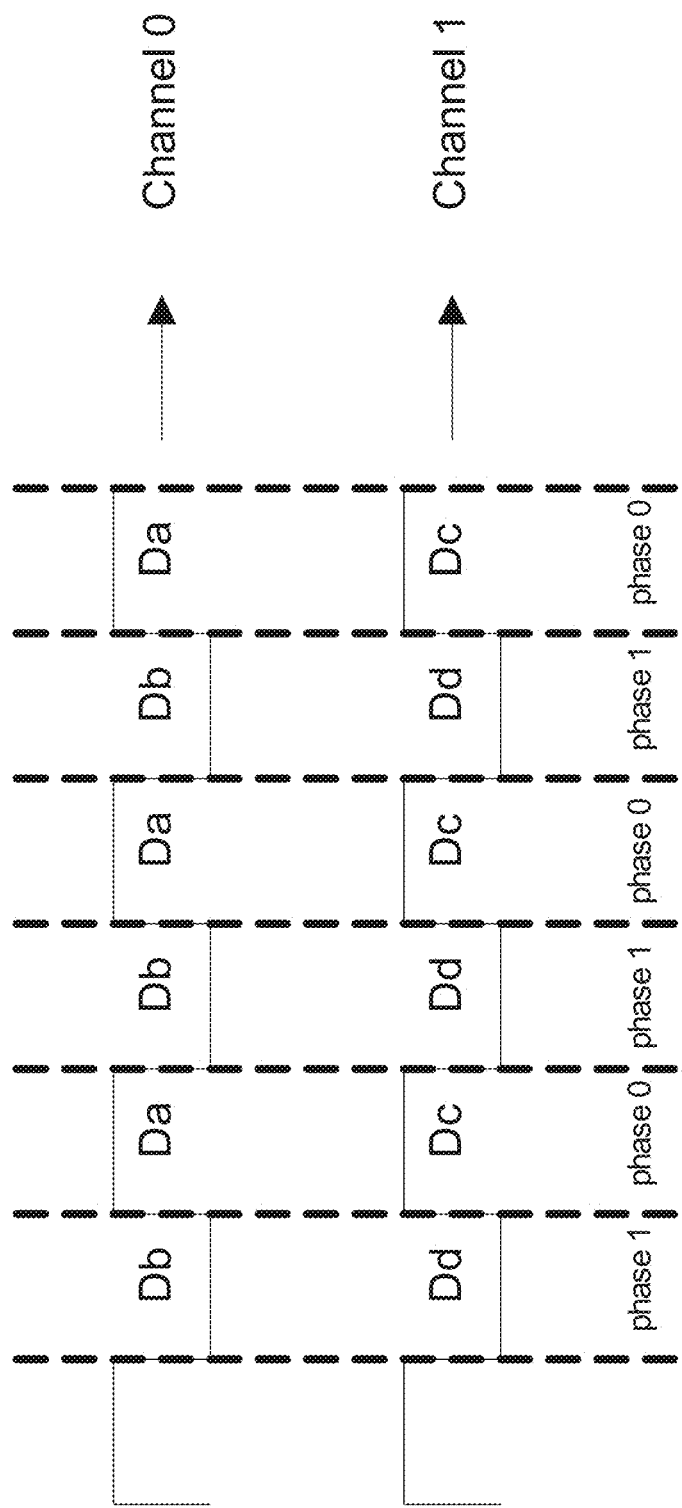
FIG. 6 depicts an example interleaved data transfer occurring over channels 1 and 2 of a 2-pair communication system.

In the example system of FIG. 3, transmitted symbols are interleaved as Da, Db, Da, Db . . . on channel 0, and transmitted symbols are interleaved as Dc, Dc, Dd . . . on channel 1, as shown in FIG. 6. Thus, data symbols "a" and "b" are interleaved on the channel 0, and data symbols "c" and "d" are interleaved on the channel 1. The period in which Da and Dc are transferred is phase 0, the period in which Db and Dd are transferred is phase 1. This interleaving method can be seen in FIG. 3, where least-mean square (LMS) engines 304 for channel 0 output data 306 for data symbols "a" and "b," and LMS engines 304 for channel 1 output data 306 for data symbols "c" and "d." The output 306 from the LMS engines 304 is received at Decision Feedback Equalization, Finite Impulse Response (DFE FIR) filter blocks 308. As illustrated in FIG. 3, the DFSE 300 includes four DFE FIR filter blocks 308. Two of the DFE FIR filter blocks 308 correspond to channel 0 and receive data for data symbols "a" and "b," and two of the DEE FIR filter blocks 308 correspond to channel 1 and receive data for data symbols "c" and "d." In one example, each DEE FIR filter block 308 includes eight DFE filters.

Figure 7:
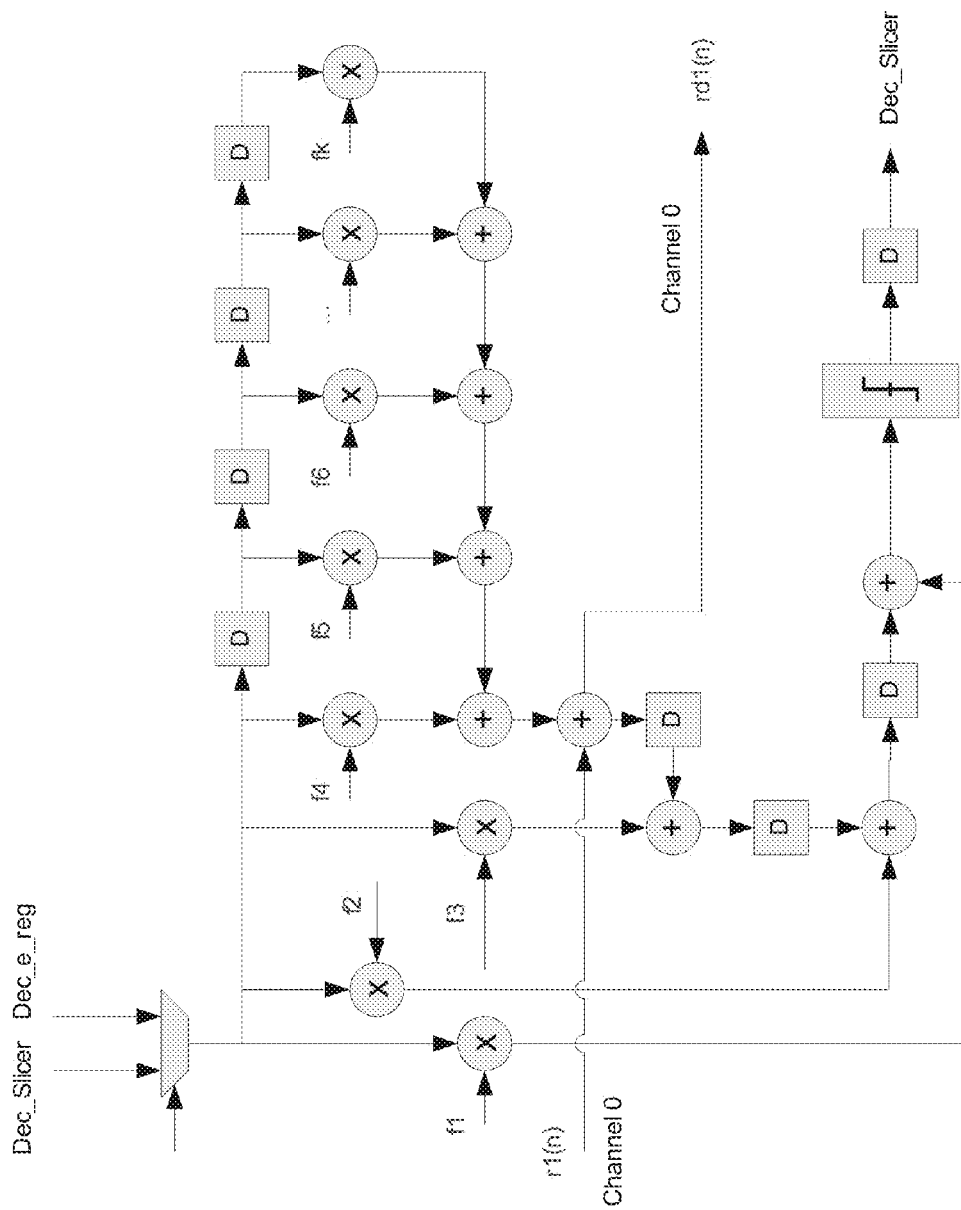
FIG. 7 depicts an example channel 0 of a DFE filter block.
Figure 8:
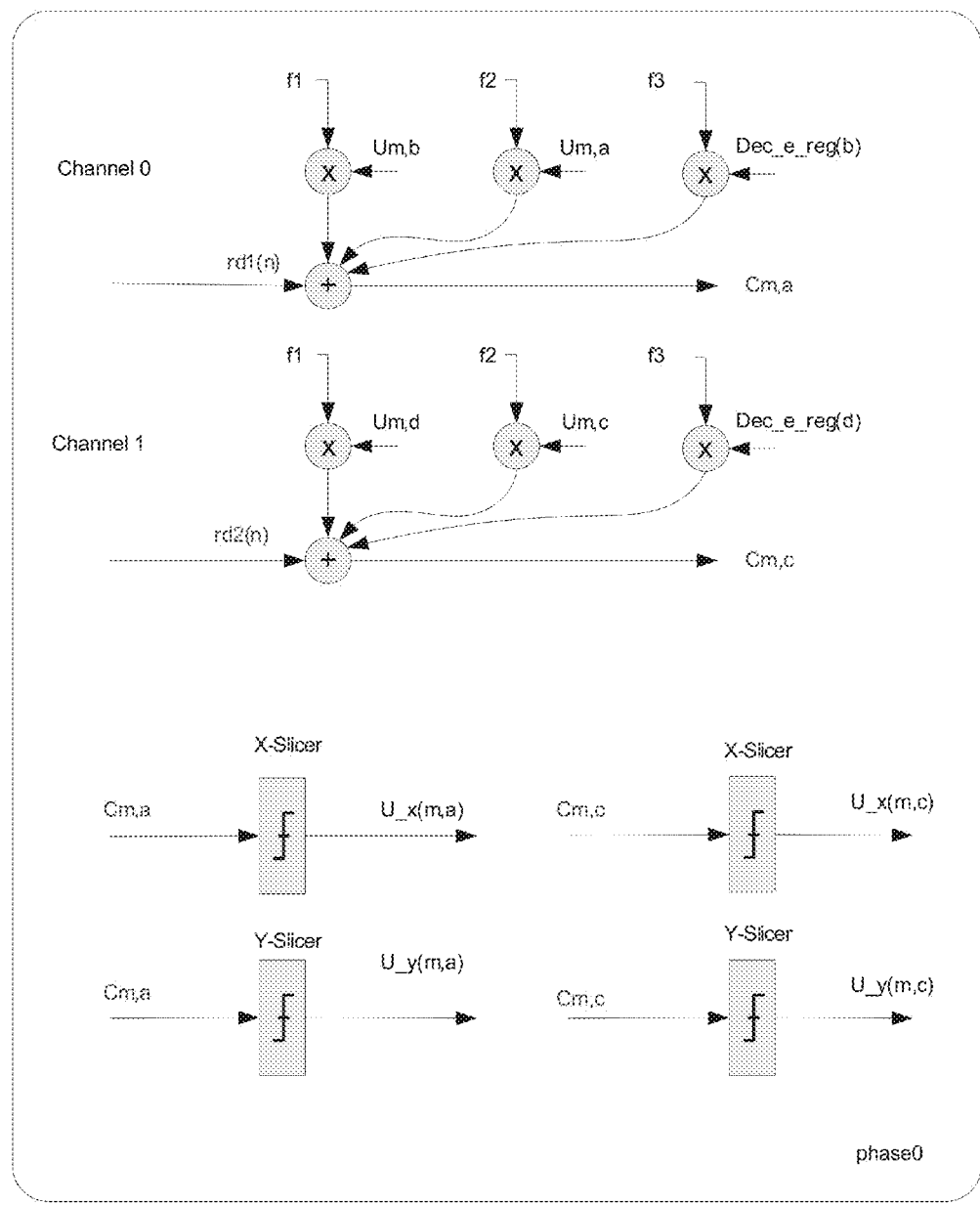
FIG. 8 depicts an example generation of Cm,a, Cm,c, Um_x, and Um_y data during a first phase (i.e., phase 0) of a branch metric calculation.
Figure 9:
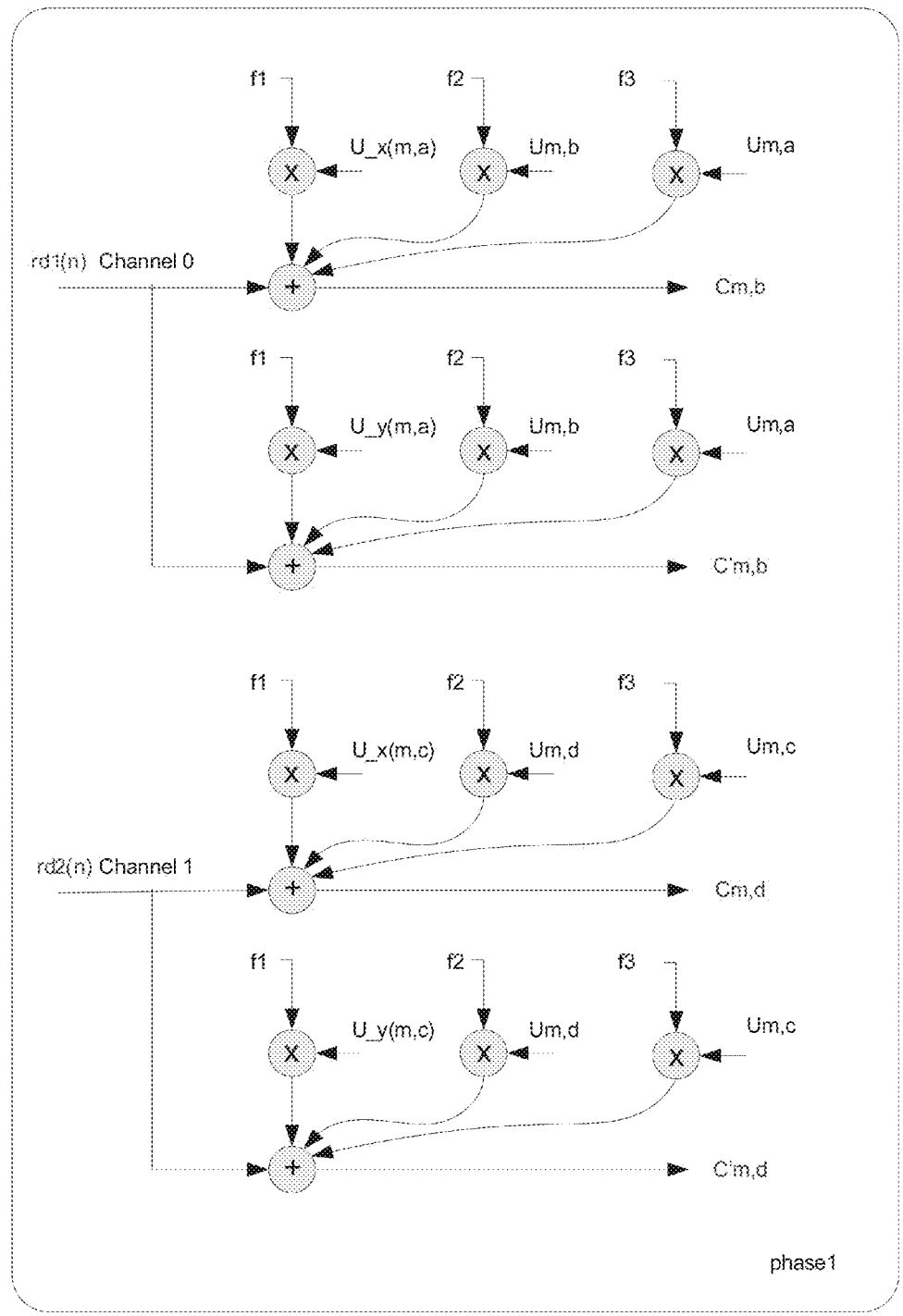
FIG. 9 depicts an example generation of Cm,b, Cm,d, C'm,b, and C'm,d data during a second phase (i.e., phase 1) of a branch metric calculation.

As described below with respect to FIG. 4, each DFE filter block 308 may also receive input from a feed forward equalizer (FEE). An exemplary DEE filter for the channel 0 is illustrated in FIG. 7. For each DEE filter block 308, the inputs r1 and r2 from the FEE of channel 0 and channel 1, respectively, may be summed with the outputs of each of the DFE filters as rd and rd2, respectively, to provide eight DFE outputs 310, one for a survivor path of each state. Thus, the DEE filter block 308 for channel 0 that receives data for symbol "a" outputs eight DFE outputs Cm,a (c0_0, . . . c7_0), and the DFE, filter block 308 for channel 1 that receives data for symbol "c" outputs eight DFE outputs Cm,c (c0_1 . . . c7_1), as shown in FIG. 8. The DFE filter block 308 for channel 0 that receives data for symbol "b" outputs eight DFE outputs Cm,c (c0_2 . . . c7_2), and the DFE filter block 308 for channel 1 that receives data for symbol "d" outputs eight DEE outputs Cm,d (c0_3 . . . c7_3) as shown in FIG. 9. Further, as illustrated in FIG. 3, DEE filter blocks 308 that correspond to channel 1 each output an additional eight DEE outputs: the DFE filter block 308 for channel 1 that receives data for symbol "c" outputs eight additional DFE outputs C'm,b (c'0_1 . . . c'7_1), and the DFE filter block 308 for channel 1 that receives data for symbol "d" outputs eight additional DFE outputs C'm,d (c'0_3 . . . c'7_3), as is also shown in FIG. 9. The C'm,b and C'm,d in addition to Cm,a, Cm,b, Cm,c and Cm,d are used to generate the possible decisions and errors, which are used to produce the branch metrics based on the specific states.

A branch metric generation module 312 receives the DEE outputs 310 from the four DFE filter blocks 308 and may perform operations similar to those described above for branch metric unit 258 of FIG. 2. The branch metric generation module 312 uses the DEE outputs 310 to generate thirty-two branch metrics 314 (bm0_0 . . . bm7_7) and thirty-two decision outputs 316, one corresponding to each branch metric (dec0_0 . . . dec7_7). A radix-4 add-compare-select (ACS) unit 318 receives the thirty-two branch metrics 314 and thirty-two decision outputs 316 from the branch metric generation module 312. The ACS unit 318 selects eight "winners" from the thirty-two branch metrics 314 and the thirty-two decision outputs 316 to be used in a next iteration of the decoder. The Viterbi detector thus includes the ACS 318 to select the most promising path for each of the eight states of the Viterbi detector and to output the most promising paths as eight path selects 332 (sel0 . . . sel7). A survivor path module 330 is used to receive the eight path selects 332 and to store survivor paths leading up to each of the eight states. The Viterbi detector further maintains a metric of each of the eight states, where the metric represents the quality of each of the eight states. These metrics are output by the ACS 318 as the eight path metrics 322 (pm0 . . . pm7). The eight path metrics 322 are received at a minimum path metric select unit 324. In the example of FIG. 3, both the ACS 318 and the minimum path metric select unit 324 may operate at 125 MHz, while the branch metric generation module 312 may operate at 250 MHz.

The ACS 318 also generates eight early decision outputs 328 (e_dec_0 . . . e_dec_7) that are received by the minimum path metric select unit 324 and the survivor path module 330. The minimum path metric select unit 324 receives the eight early decision outputs 328, the eight path metrics 322, and eight decision outputs 334 (dec_0 . . . dec_7) from the survivor path module 330. The minimum path metric select unit 324 uses these inputs to generate a final decision 336, which is a decision from the survivor path of the best state. The final decision 336 may represent the output of the Viterbi detector utilized as part of the DFSE 300 and may have a data rate of 250 Mbps and a symbol rate of 125 Mbaud.

The DFSE 300 of FIG. 3 incorporates a number of feedback mechanisms. The ACS 318, after receiving the thirty-two branch metrics 314 and the thirty-two decision outputs 316 from the branch metric generation module 312, uses these inputs to determine eight symbols in the survivor path of each state 320 Um (u0 . . . u7). The Um consists of Um,a, Um,b, Um,c and Um,d. For example, u0 is consisted of U0,a, U0,b, U0,c and U0,d. The eight symbols in the survivor path of each state 320 are fed back into the DFE FIR filter blocks 308 and used in a next decoding iteration. Similarly, the minimum path metric select unit 324 receives inputs from the ACS 318 and the survivor path module 330 (i.e., eight path metrics 322, eight early decision outputs 328, and eight decision outputs 334) and uses these inputs to determine an early decision from the survivor path of the best state 326 (edec). The early decision from the survivor path of the best state 326 is fed back into the DFE FIR filter blocks 308 and used in a next decoding iteration.

The DFSE 300 of FIG. 3 may be used in the context of a 2-pair gigabit Ethernet system (e.g., the 2-pair gigabit Ethernet system illustrated in FIG. 1). Such a 2-pair gigabit Ethernet system may be used for a variety of applications (e.g., 2-pair Auto-Phy) and may interface with existing 4-pair Ethernet systems. For example, the 2-pair gigabit Ethernet system may share the same trellis code encoder as the legacy gigabit Phy, such that the trellis code encoder may be used both in the legacy, 4-pair gigabit Phy and also the 2-pair system.

As described above, an example 2-pair Ethernet communication system may involve the transmission of interleaved data over two twisted pairs of cable. Due to the use of the interleaved data, the branch metric generation may be performed in a particular manner, in the example system 300 of FIG. 3, data is interleaved as Da, Db, Da, Db . . . on channel 0 a first channel includes data symbols "a" and "b" interleaved on it) and Dc, Dd, Dc, Dd . . . on channel 1 (i.e., a second channel includes data symbols "c" and "d" interleaved on it). The branch metric calculation occurring in the branch metric generation module 312 is divided into two phases for phase0 and phase1. In phase0, the branch metrics related to Da and Dc are calculated as follows:

$$c(m,a)=rd1(n)+f1(n)*u(m,2*n)+f2(n)*u(m,a)+f3(n)*dec\_e\_reg(b), \text{ and}$$

$$c(m,c)=rd2(n)+f1(n)*u(m,2*n)+f2(n)*u(m,c)+f3(n)*dec\_e\_reg(d),$$

where m=0, 1, 2, 3, 4, 5, 6, 7; f1 t2, and f3 are coefficients of the decision feedback filter of the DFSE 300; rd is an input to a slicer component of the DFSE 300 without feedback related to f1, f2, and f3; u is the Viterbi state data; dec_e_reg is the early decision from the Viterbi detector.

In phase 1, the branch metric calculations related to Db and Dd are as follows:

$$c(m,b)=rd1(n)+f1(n)*u\_x(m,a)+f2(n)*(m,b)+f3(n)*u(m,a),$$

$$c'(m,b)=rd1(n)+f1(n)*u\_y(m,a)+f2(n)*(m,b)+f3(n)*u(m,a),$$

$$c(m,d)=rd2(n)+f1(n)*u\_x(m,c)+f2(n)*(m,b)+f3(n)*u(m,c), \text{ and}$$

$$c'(m,d)=rd2(n)+f1(n)*u\_y(m,c)+f2(n)*(m,d)+f3(n)*u(m,c),$$

where u_x and u_y are the outputs of the slicer output based on c(m, a) and c(m, c), as shown in FIG. 8. Branch metrics are selected based on the trellis code transition and norm of the errors. In the above equations, n is the time index. For example, rd1(n) is the output of the DFE for channel 0 at time n*T, where T is the sample period.

Figure 4:
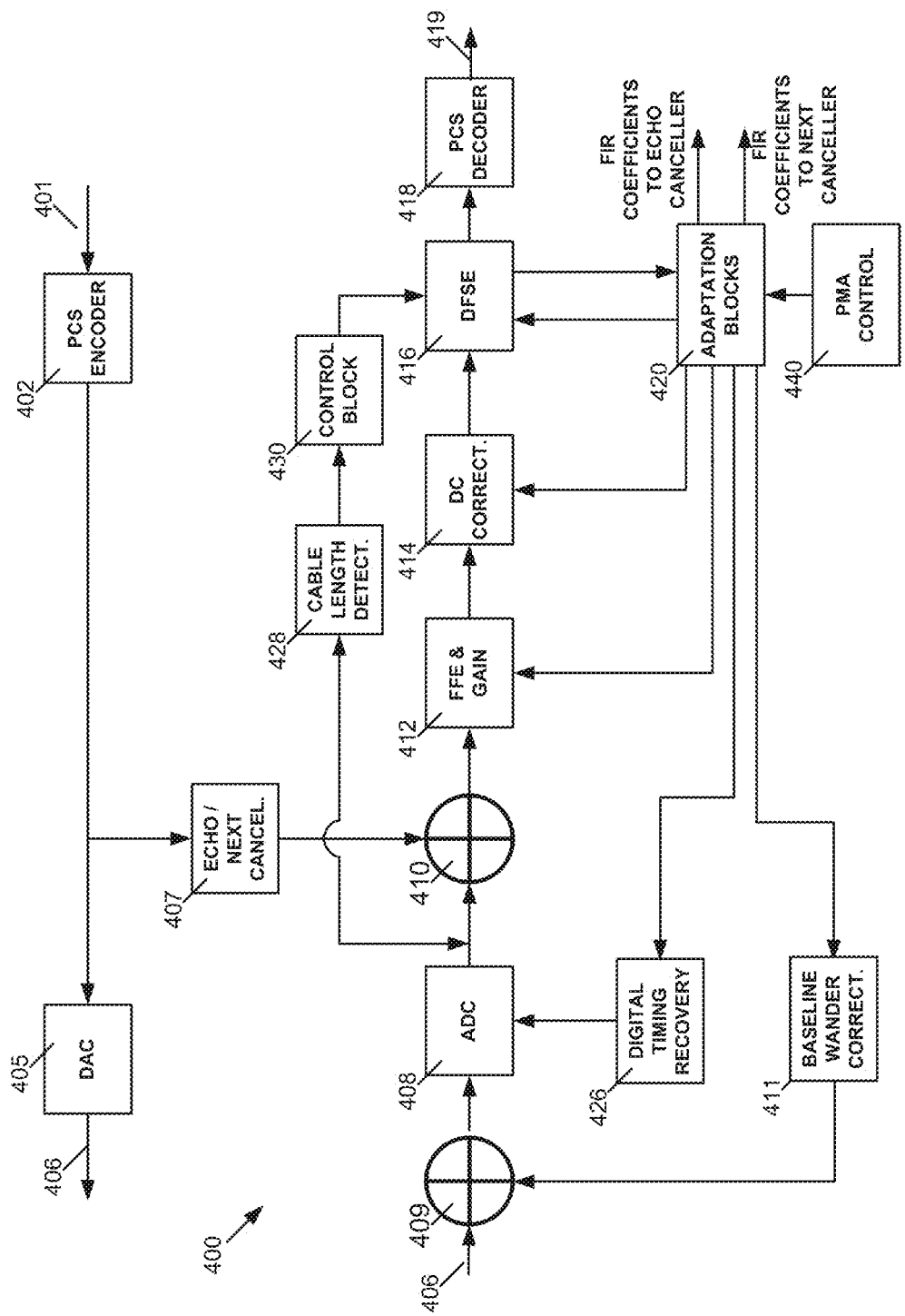
FIG. 4 is a block diagram depicting an example transceiver configured for operation with a 2-pair communication system.

FIG. 4 is a block diagram depicting an example transceiver 400 configured for operation with a 2-pair communication system. Although only one channel is depicted in FIG. 4, two parallel channels are used in the 2-pair communication system. A digital input signal 401 is PCS-encoded in a PCS encoder 402 and is then supplied to a digital-to-analog converter (DAC) 405 for transmission via Ethernet cable 406. The PCS-encoded signal is also supplied to a NEXT (Near End Transmitter) noise canceller and adaptive echo canceller 407. The NEXT and echo canceller 407 is configured to cancel noise in the encoded signal.

At a receiving portion of the transceiver 400, signals from the Ethernet cable 406 are received at adder 409 and added with correction signals supplied from baseline wander correction block 411, which may be used to correct for DC offset or baseline wander. The added signals are then converted to digital signals in analog-to-digital converter (ADC) 408, as controlled by digital timing recovery block 426. The digital timing recovery block 426 may control the sampling phase of the ADC 408 based on a data error. The digital signals from ADC 408 are added with the echo-cancelled and NEXT-cancelled signals in adder 410. The added signals are supplied to a Feed Forward Equalizer (FFE) and gain filter 412, which filters the signal prior to the Viterbi trellis decoding in DFSE 416. Prior to receipt at the DFSE 416, tho digital signal may undergo DC correction at DC correction block 414.

As described above, the DFSE 416 may include a decision feedback equalizer (DFE), slicer, and Viterbi detector. In the DFSE 416, the data is de-interleaved and converted from 2-channel, 500 Mbps, 250 Mbaud data to 4-channel, 250 Mbps, 125 Mbaud data. After the decoding in the DFSE 416, the output signal is supplied to PCS decoder 418, which may provide an output signal 419 to any number of devices (e.g., a personal computer, router, or switch). The DFSE 416 may also supply an output signal to a plurality of adaptation blocks 420. The adaptation blocks 420 carry out corrections for such conditions as temperature offset, connector mismatch, etc. The adaptation block 420 provides output to the baseline wander correction block 411, the digital timing recovery block 426, the echo and NEXT canceller 407, the FFE 412, and the DC correction block 414. The adaptation blocks 420 are also coupled to Physical Medium Attachment (PMA) control block 440. Each functional block depicted in FIG. 4 may include a slave state controller for controlling the operation and timing of the corresponding block.

The transceiver 400 of FIG. 4 further includes a cable length detection module 428 configured to determine a length of a cable being used with the transceiver 400 (e.g., the Ethernet cable 406 or another cable or connection of the transceiver 400) and to enable or disable the Viterbi detector of the DFSE 416 based on the length of the cable. Thus, as illustrated in FIG. 4, the cable length detector module 428 connects to a portion of the transceiver 400 in such a way that allows the cable length detector module 428 to determine the length of an attached cable. In the example of FIG. 4, the cable length detector module 428 is connected to the circuit between the ADC 408 and the adder 410, enabling the cable length detector module 428 to determine the length of the cable. In other examples, the cable length detection module 428 is coupled to the transceiver 400 at other points or at additional points. The length of the cable is output by the cable length detector module 428 and received by a control block 430. The control block 430 is coupled to the DFSE 416 and may be configured to enable or disable the Viterbi detector of the DFSE 416 automatically based on the received length of the cable. Specifically, in one example, the Viterbi detector is enabled when the length of the cable is determined to be long, and the Viterbi detector is disabled when the length of the cable is determined to be short. Further, the Viterbi detector may be disabled in a power saving mode by the control block 430 or by another component.

The high speed communication enabled by the two-pair communication system described herein may be used in a variety of applications (e.g., high-tech automotive applications, such as in vehicles and boats). The two-pair communication system may be configured to support the IEEE Ethernet standard and may, for example, share the IEEE PCS command set for 1 gigabit Ethernet with 1000 Mbps mode and be configured to operate with legacy 1000BASE-T hardware. The two-pair communication systemay further offer similar features as the power over Ethernet (POE) protocol.

Figure 5:
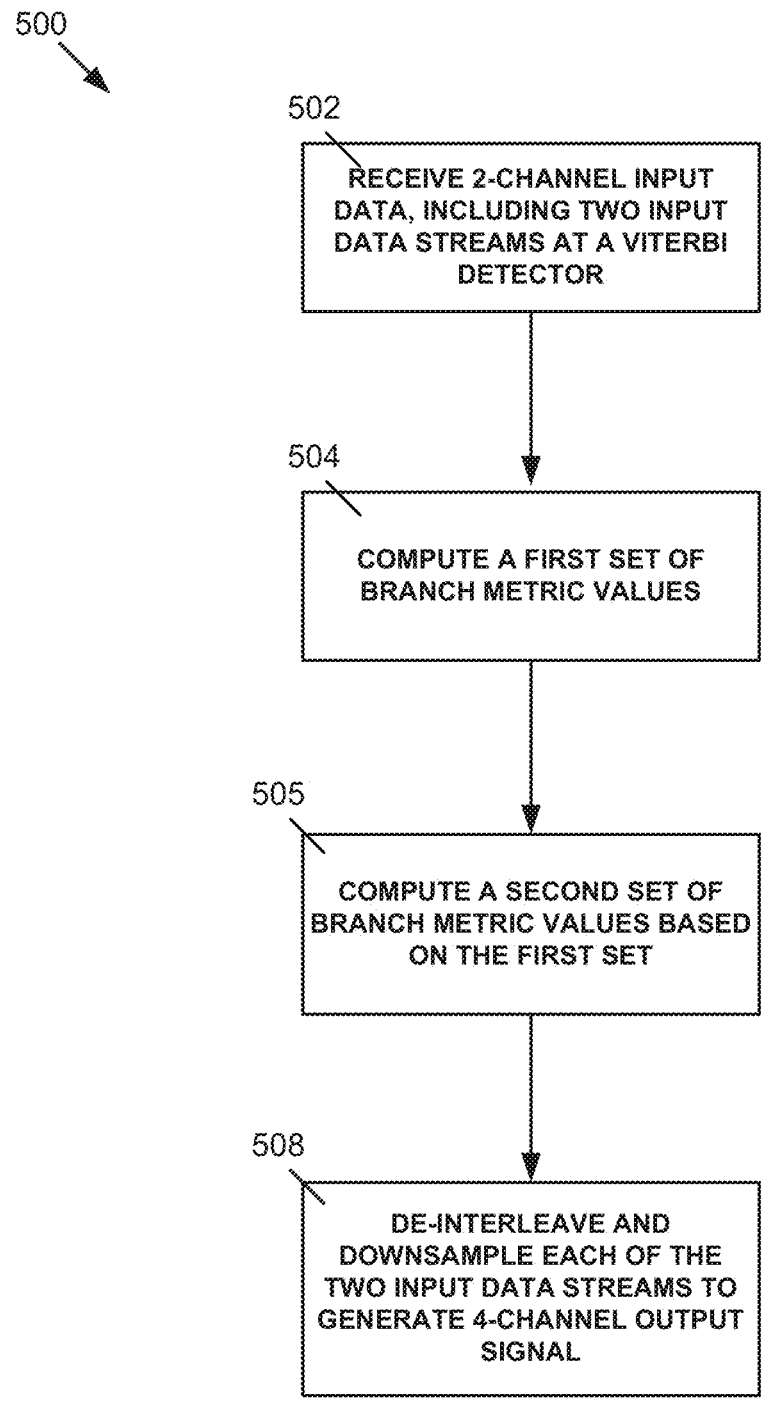
FIG. 5 is a flowchart illustrating an example method for transferring data over a 2-pair communication system.

FIG. 5 is a flowchart 500 illustrating an example method for transferring data over a 2-pair communication system. At 502, two input data streams are received at a Viterbi detector. The two input data streams, each of which includes a first data symbol interleaved with a second data symbol, are converted into an output signal at the Viterbi detector. At 504, a first set of branch metric values is computed for the first data symbols of the two input data streams. At 506, a second set of branch metric values is computed for the second data symbols of the two input data streams, where the computing of the second set is based on the first set. At 508, each of the two input data streams are de-interleaved and downsampled to generate the output signal, where the output signal includes four channels of data generated based on the first and second sets of branch metric values. Each of the four channels is of a lower data rate than each of the two input data streams.

This written description uses examples to disclose various aspects and implementations of the invention, including the best mode, and also to enable a person skilled in the art to make and use the invention. The patentable scope of the invention may include other examples. Additionally, the methods and systems described herein may be implemented or many different types of processing devices by program code comprising program instructions that are executable by the device processing subsystem. The software program instructions may include source code, object code, machine code, or any other stored data that is operable to cause a processing system to perform the methods and operations described herein. Other implementations may also be used, however, such as firmware or even appropriately designed hardware configured to carry out the methods and systems described herein.

The systems' and methods' data (e.g., associations, mappings, data input, data output, intermediate data results, final data results, etc.) be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

It should be understood that as used in the description herein and throughout the claims that follow, the meaning of "a," "an," and "the" includes plural reference unless the context clearly dictates otherwise. Also, as used in the description herein and throughout the claims that follow, the meaning of "in" includes "in" and "on" unless the context clearly dictates otherwise. Further, as used in the description herein and throughout the claims that follow, the meaning of "each" does not require "each and every" unless the context clearly dictates otherwise. Finally, as used in the description herein and throughout the claims that follow, the meanings of "and" and "or" include both the conjunctive and disjunctive and may be used interchangeably unless the context expressly dictates otherwise; the phrase "exclusive of" may be used to indicate situations where only the disjunctive meaning may apply.

What is claimed is:

1. A communication device configured for operation with a 2-pair communication system, the communication device comprising:
   a slicer for resolving data symbols of two input data streams;
   a decision feedback equalizer for filtering the two input data streams; and
   a Viterbi detector configured to receive the two input data streams and to convert the two input data streams into an output signal, the Viterbi detector executing steps including
   receiving the two input data streams, each of the two input data streams including a first data symbol interleaved with a second data symbol,
   computing a first set of branch metric values for the first data symbols of the two input data streams,
   computing a second set of branch metric values for the second data symbols of the two input data streams, the computing of the second set of branch metric values for the second data symbols being based on the first set of branch metric values for the first data symbols, and
   de-interleaving and downsampling each of the two input data streams to generate the output signal, the output signal including four channels of data generated based on (i) the first set of branch metric values for the first data symbols and (ii) the second set of branch metric values for the second data symbols, with each of the four channels of the output signal being of a lower data rate than each of the two input data streams,
   wherein the Viterbi detector includes a branch metric unit configured to compute, based on output signals of the slicer and the decision feedback equalizer, the first set of branch metric values for the first data symbols and the second set of branch metric values for the second data symbols.

2. The communication device of claim 1, wherein:
   the Viterbi detector is configured to operate over the 2-pair communication system, wherein the 2-pair communication system is a gigabit Ethernet system including two twisted pairs of cable, wherein the two input data streams each have a data rate of 500 Mbps, and Wherein the four channels of the output signal each have a data rate of 250 Mbps.

3. The communication device of claim 2, wherein the two input data streams each have a symbol rate of 250 Mbaud, and wherein each of the four channels of the output signal have a symbol rate of 125 Mbaud.

4. The communication device of claim 1, wherein:
   data symbols "a" and "b" are interleaved on a first input data stream of the two input data streams, and data symbols "c" and "d" are interleaved on a second input data stream of the two input data streams;
   the branch metric unit computes the first and the second sets of branch metric values in two phases,
   wherein in a first phase of the two phases, phase 0, branch metric values for the data symbols "a" and "c" are calculated according to first equations:

$$c(m,a) = rd1(n) + f1(n)*u(m,2*n) + f2(n)*u(m,a) + f3(n)*dec\_e\_reg(b), \text{ and}$$

$$c(m,c) = rd2(n) + f1(n)*u(m,2*n) + f2(n)*u(m,c) + f3(n)*dec\_e\_reg(d),$$

where in is equal to 0, 1, 2, 3, 4, 5, 6, 7 f1, f2, and f3 are coefficients of the decision feedback equalizer; rd is an input to the slicer without feedback regarding f1, f2, and f3; u is Viterbi state data and dec_e_reg is an early decision from the Viterbi detector, and wherein in a second phase of the two phases, phase 1, branch metric values for the data symbols "b" and "d" are calculated according to second equations:

$$c(m,b)=rd1(n)+f1(n)*u\_x(m,a)+f2(n)*(m,b)+f3(n)*u(m,a),$$

$$c'(m,b)=rd1(n)+f1(n)*u\_y(m,a)+f2(n)*(m,b)+f3(n)*u(m,a),$$

$$c(m,d)=rd2(n)+f1(n)*u\_x(m,c)+f2(n)*(m,b)+f3(n)*u(m,c), \text{ and}$$

$$c'(m,d)=rd2(n)+f1(n)*u\_y(m,c)+f2(n)*(m,d)+f3(n)*u(m,c),$$

where u_x and u_y are outputs of the slicer based on c(m, a) and c(m, c).

5. The communication device of claim 1, further comprising:
a cable length detection module configured to determine a length of a cable connected to the communication device; and
a control module coupled to the cable length detection module, wherein the control module is configured to automatically enable or disable the Viterbi detector based on the length of the cable as determined by the cable length detection module.

6. The communication device of claim 5,
wherein the control module is configured to disable the Viterbi detector if the length of the cable determined to be shorter than a predetermined length; and
wherein the control module is configured to enable the Viterbi detector if the length is of the cable determined to be greater than the predetermined length.

7. The communication device of claim 1, wherein each of the two input data streams includes three or more interleaved data symbols.

8. The communication device of claim 1, wherein the 2-pair communication system is configured to transmit data within an automobile, truck, bus, train, ship, boat, aircraft, or vehicle.

9. A communication device configured for operation with a 2-pair communication system the communication device comprising:
a Viterbi detector configured to receive two input data streams and to convert the to input data streams into an output signal, the Viterbi detector executing steps including
receiving the two input data streams, each of the two input data streams including a first data symbol interleaved with a second data symbol,
computing a first set of branch metric values for the first data symbols of the two input data streams,
computing a second set of branch metric values for the second data symbols of the two input data streams, the computing of the second set of branch metric values for the second data symbols being based on the first set of branch metric values for the first data symbols, and
de-interleaving and downsampling each of the two input data streams to generate the output signal, the output signal including four channels of data generated based on (i) the first set of branch metric values for the first data symbols and (ii) the second set of branch metric values for the second data symbols, with each of the four channels of the output signal being of a lower data rate than each of the two input data streams; and a circuit configured to input an input signal into the 2-pair communication system, the circuit including
a multiplexer configured to receive four channels of data from the input signal, and
an interleaver coupled to an output of the multiplexer, wherein the interleaver is configured to interleave data symbols of the four channels to generate the two input data streams.

10. A method for transferring data over a 2-pair communication system, the method comprising:
receiving two input data streams at a Viterbi detector; and
converting the two input data streams into an output signal at the Viterbi detector, the Viterbi detector executing steps including
receiving the two input data streams, each of the two input data streams including a first data symbol interleaved with a second data symbol,
computing a first set of branch metric values for the first data symbols of the two input data streams,
computing a second set of branch metric values for the second data symbols of the two input data streams, the computing of the second set of branch metric values for the second data symbols being based on the first set of branch metric values for the first data symbols, and
de-interleaving and downsampling each of the two input data streams to generate the output signal, the output signal including four channels of data generated based on the first set of branch metric values for the first data symbols and the second set of branch metric values for the second data symbols, with each of the four channels of the output signal being of a lower data rate than each of the two input data streams.

11. The method of claim 10, wherein:
the 2-pair communication system is a gigabit Ethernet system including two twisted pairs of cable;
the two input data streams each have a data rate of 500 Mbps; and
the four channels of the output signal each have a data rate of 250 Mbps.

12. The method of claim 11, wherein:
the two input data streams each have a symbol rate of 250 Mbaud; and
the four channels of the output signal each have a symbol rate of 125 Mbaud.

13. The method of claim 10, further comprising:
resolving the data symbols of the two input data streams at a slicer; and
filtering the two input data streams at a decision feedback equalizer,
wherein computing the first set of branch metric values for the first data symbols and computing the second set of branch metric values for the second data symbols
computing, based on output signals of the slicer and the decision feedback equalizer, the first set of branch metric values for the first data symbols and the second set of branch metric values for the second data symbols at a branch metric unit of the Viterbi decoder.

14. The method of claim 13, wherein:
data symbols "a" and "b" are interleaved on a first input data stream of the two input data streams, and data symbols "c" and "d" are interleaved on a second input data stream of the two input data streams; and
the first and second sets of branch metric values are computed in two phases, wherein in a first phase of the two phases, phase 0, branch metric values for the data symbols "a" and "c" are calculated according to first equations:

$$c(m,a)=rd1(n)+f1(n)*u(m,2*n)+f2(n)*u(m,a)+f3(n)*dec\_e\_reg(b), \text{ and}$$

$$c(m,c)=rd2(n)+f1(n)*u(m,2*n)+f2(n)*u(m,c)+f3(n)*dec\_e\_reg(d),$$

where m is equal to 0, 1, 2, 3, 4, 5, 6, 7; f1, f2, and f3 are coefficients of the decision feedback equalizer; rd is an input to the slicer without feedback regarding f1, f2, and f3; u is Viterbi state data; and dec_e_reg is an early decision from the Viterbi detector; and wherein in a second phase of the two phases, phase 1, branch metric values for the data symbols "b" and "d" are calculated according to second equations;

$$c(m,b)=rd1(n)+f1(n)*u\_x(m,a)+f2(n)*(m,b)+f3(n)*u(m,a),$$

$$c'(m,b)=rd1(n)+f1(n)*u\_y(m,a)+f2(n)*(m,b)+f3(n)*u(m,a),$$

$$c(m,d)=rd2(n)+f1(n)*u\_x(m,c)+f2(n)*(m,b)+f3(n)*u(m,c), \text{ and}$$

$$c'(m,d)=rd2(n)+f1(n)*u\_y(m,c)+f2(n)*(m,d)+f3(n)*u(m,c),$$

where u_x and uy are outputs of the slicer based on c(m, a) and c(m, c).

15. The method of claim 10, further comprising:
inputting the two input data streams into the 2-pair communication system, the inputting including
receiving four channels of data at a multiplexer; and
interleaving data symbols of the four channels to generate the two input data streams at an interleaver, wherein an output of the multiplexer is coupled to an input of the interleaver.

16. The method of claim 10, further comprising:
determining a length of a cable connected to the 2-pair communication system; and
automatically enabling or disabling the Viterbi detector based on the determined length of the cable.

17. The method of claim 16, further comprising:
automatically disabling the Viterbi detector if the length is determined to be shorter than a predetermined length; and
automatically enabling the Viterbi detector if the length is determined to be longer than the predetermined length.

18. The method of claim 10, wherein:
each of the two input data streams includes three or more interleaved data symbols.

19. The method of claim 10, wherein:
the 2-pair communication system is configured to transmit data of the two input data streams within an automobile, truck, bus, train, ship, boat, aircraft, or vehicle.

* * * * *